United States Patent
Yokoi et al.

(10) Patent No.: US 11,328,405 B2
(45) Date of Patent: May 10, 2022

(54) ELECTRONIC COMPONENT MOUNTING ORIENTATION CHECKING SYSTEM AND ELECTRONIC COMPONENT MOUNTING ORIENTATION CHECKING METHOD

(71) Applicant: FUJI CORPORATION, Chiryu (JP)

(72) Inventors: Yuta Yokoi, Kariya (JP); Takahiro Kobayashi, Chiryu (JP); Shuichiro Kito, Toyota (JP)

(73) Assignee: FUJI CORPORATION, Chiryu (JP)

( * ) Notice: Subject to any disclaimer, the term of this patent is extended or adjusted under 35 U.S.C. 154(b) by 51 days.

(21) Appl. No.: 16/767,304

(22) PCT Filed: Dec. 4, 2017

(86) PCT No.: PCT/JP2017/043426
§ 371 (c)(1),
(2) Date: May 27, 2020

(87) PCT Pub. No.: WO2019/111291
PCT Pub. Date: Jun. 13, 2019

(65) Prior Publication Data
US 2020/0410663 A1    Dec. 31, 2020

(51) Int. Cl.
*G06T 7/00*    (2017.01)
*H05K 3/34*    (2006.01)

(52) U.S. Cl.
CPC ......... *G06T 7/0004* (2013.01); *H05K 3/3436* (2013.01); *G06T 2207/30141* (2013.01)

(58) Field of Classification Search
CPC ........ G06T 7/0004; G06T 2207/30141; H05K 13/0815; H05K 13/0882; H05K 3/3436
(Continued)

(56) References Cited

U.S. PATENT DOCUMENTS 5,526,974 A  *  6/1996  Gordon ............. H05K 13/0413
                                                                          228/103
2002/0177335 A1* 11/2002  Tsuchioka ........ G06K 19/07732
                                                                          439/76.1
(Continued)

FOREIGN PATENT DOCUMENTS

JP          64-26984 A       1/1989
JP          6-195116 A  *    7/1994
(Continued)

OTHER PUBLICATIONS

International Search Report dated Jan. 30, 2018 in PCT/JP2017/043426 filed Dec. 4, 2017, 2 pages.

*Primary Examiner* — Sheela C Chawan
(74) *Attorney, Agent, or Firm* — Oblon, McClelland, Maier & Neustadt, L.L.P.

(57) ABSTRACT

A representation of the electronic component to be mounted according to a production program is displayed so as to be superimposed on the image of the mounting area on the display device, and the production program is edited so that a mounting orientation of the electronic component matches an orientation of the pad pattern, in a case where the mounting orientation of the electronic component designated in the production program does not match the orientation of the pad pattern in the mounting area when an operator looks at the representation of the electronic component displayed so as to be superimposed on the image of the mounting area on the display device.

14 Claims, 4 Drawing Sheets

(58) Field of Classification Search
USPC ....... 382/141, 145, 100, 143, 144, 147, 151, 382/152
See application file for complete search history.

(56) References Cited

U.S. PATENT DOCUMENTS

| | | | | |
|---|---|---|---|---|
| 2006/0186180 A1* | 8/2006 | Bosco | ................... | H05K 3/3436 |
| | | | | 228/180.22 |
| 2015/0146005 A1* | 5/2015 | Amano | .............. | H05K 13/0812 |
| | | | | 348/159 |

FOREIGN PATENT DOCUMENTS

| | | | |
|---|---|---|---|
| JP | 10-190300 A | | 7/1998 |
| JP | 2004-179299 A | * | 6/2004 |
| JP | 2004-179299 A | | 6/2004 |
| JP | 2010-73958 A | | 4/2010 |

* cited by examiner

ELECTRONIC COMPONENT MOUNTING ORIENTATION CHECKING SYSTEM AND ELECTRONIC COMPONENT MOUNTING ORIENTATION CHECKING METHOD

TECHNICAL FIELD

The present specification discloses a technique relating to an electronic component mounting orientation checking system and an electronic component mounting orientation checking method, which check a mounting orientation of an electronic component to be mounted on a circuit board in accordance with a production program (production job) before starting the production.

BACKGROUND ART

As described in Patent Literature 1 (JP-A-2010-73958), an electronic component mounter for mounting an electronic component on a circuit board picks up multiple types of electronic components supplied from multiple feeders in an order designated by a production program and mounts the electronic component on a designated position of the circuit board. At this time, since not only the electronic components having the same mounting orientation, but also the electronic components having different mounting orientations are mixed in the electronic components to be mounted on the circuit board, the mounting orientations of the electronic components are also designated in the production program.

In addition, there is a possibility that the mounting position of the electronic component designated in the production program may deviate from a position of a pad pattern of the actual circuit board used in production due to a production error or the like of the circuit board. Therefore, there is a system in which a mounting area including the pad pattern (land pattern) of the circuit board is imaged by a camera of the electronic component mounter before starting a production, the image of the mounting area is displayed on a display device of the electronic component mounter, and an imaginary mounted state of the electronic component, being mounted according to a production program, is displayed by superimposing the imaginary mounted state on the image of the mounting area, which enables an operator to visually check whether the mounting position of the electronic component is deviated. In such a system, for a case where the operator determines that the mounting position of the electronic component is deviated from the position of the pad pattern of the circuit board, a function of editing (modifying) a production program is equipped, which enables the operator to make the mounting position of the electronic component match the position of the pad pattern by operating an input device such as a keyboard or a mouse.

PATENT LITERATURE

Patent Literature 1: JP-A-2010-73958

BRIEF SUMMARY

Technical Problem

Except for some parts such as resistors, electronic components has a directional property for use, and when the mounting orientation is wrong, defective products will be produced. In many electronic components, however, the arrangement of terminals such as leads and bumps is symmetrical with respect to a center line of a component body section. In this regard, it cannot be determined whether the mounting orientation is correct or reversed by 180° as to the electronic components with such a symmetrical terminal arrangement, only by looking at the imaginary mounted state. Further, in the case of a square electronic component, it cannot be determined whether the mounting orientation is correct or is rotated by 90°, 180°, or 270°, only by looking at the imaginary mounted state.

Moreover, since it cannot be ruled out a possibility such that an operator produces a production program with making a mistake of the mounting orientation of the electronic components, there is a possibility that defective products may be produced by relying on such a production program in which the mounting orientation of the electronic components is mistakenly recited.

As a countermeasure, test production may be performed before starting a production, such that all electronic components are mounted on the circuit board on a test basis to produce the test products, and an operator visually checks the mounting orientation of all electronic components of the test product. However, visually checking of the mounting orientation for all the electronic components of the test products takes a lot of labor and time, which turns out a factor lowering the productivity.

Solution to Problem

In order to solve the above problems, there is provided an electronic component mounting orientation checking system for checking a mounting orientation of an electronic component to be mounted on a circuit board according to a production program before starting a production, the system including: a camera configured to image a mounting area including a pad pattern on the circuit board on which the electronic component; a display device configured to display an image of the mounting area imaged by the camera; an electronic component imaginary mounted state drawing section configured to display an imaginary mounted state of the electronic component to be mounted according to the production program with a representation of the electronic component being superimposed on the image of the mounting area on the display device; and an editing function section configured to edit the production program so that the mounting orientation of the electronic component matches an orientation of the pad pattern, in a case where the mounting orientation of the electronic component designated in the production program does not match the orientation of the pad pattern in the mounting area when an operator looks at the imaginary mounted state of the electronic component displayed on the display device with the representation of the electronic component being superimposed on the image of the mounting area, wherein a pad pattern orientation indicating portion, indicating the orientation of the pad pattern, is formed in the mounting area on the circuit board, and wherein the electronic component imaginary mounted state drawing section displays the imaginary mounted state of the electronic component displayed on the display device with thereto adding a component mounting orientation indicating portion indicating the mounting orientation of the electronic component, the representation of the electronic component being superimposed on the image of the mounting area.

In this configuration, when the image of the mounting area on the circuit board and the representation of the electronic component are superimposed and displayed on the display device, the pad pattern orientation indicating portion, indicating the orientation of the pad pattern of the mounting area, and the component mounting orientation indicating portion, indicating the mounting orientation of the electronic component, are additionally displayed, the operator can easily visually check whether the mounting orientation of the electronic component designated in the production program is correct or reversed by 180° (or rotated by 90°, 180°, or 270° in a case of a square electronic component), by visually checking the pad pattern orientation indicating portion and the component mounting orientation indicating portion displayed on the display device. By this visual checking, in a case where the operator determines that the mounting orientation of the electronic component does not match the orientation of the pad pattern of the mounting area, the operator can edit the production program by operating the editing function section so that the mounting orientation of the electronic component matches the orientation of the pad pattern. Therefore, it is not necessary to perform test production for checking the mounting orientation of electronic component before the start of production, and it is possible to improve the productivity.

DESCRIPTION OF EMBODIMENTS

Hereinafter, an example will be described. First, a configuration of an electronic component mounter equipped with an electronic component mounting orientation checking system will be described with reference to FIG. 1.

Figure 1:
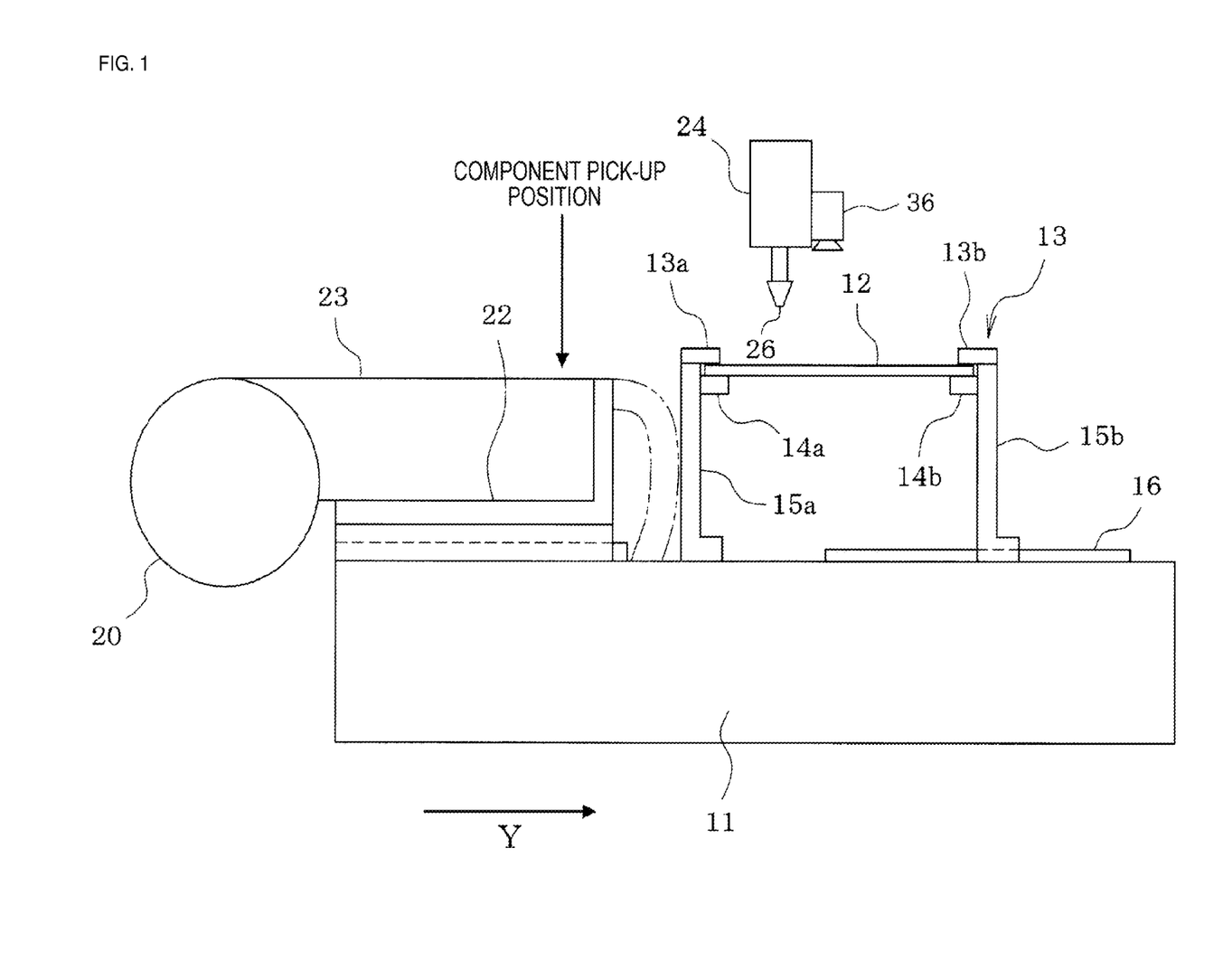
FIG. 1 is a side view illustrating a configuration of a main section of an electronic component mounter of an embodiment of the present disclosure.

Conveyor 13 for conveying circuit board 12 is provided on base table 11 of the electronic component mounter (hereinafter, a conveyance direction of circuit board 12 by conveyor 13 is defined as an X-direction, a direction perpendicular thereto is defined as a Y-direction). By fixing one support member 15a at a fixed position and adjusting a position of support member 15b in the Y-direction on a side opposite thereto along guide rail 16 by a feeding screw mechanism (not shown) or the like, among support members 15a and 15b which support two conveyor rails 13a and 13b, and conveyor belts 14a and 14b constituting conveyor 13, the width of conveyor 13 (interval between conveyor rails 13a and 13b) can be adjusted according to the width of circuit board 12.

In addition, feeder setting base 22 is provided on the side of conveyor 13 on base table 11, and multiple feeders 23 is set to feeder setting base 22 detachably in the Y-direction. In each feeder 23, reel 20 on which a component supply tape containing multiple electronic components at equal pitches is wound is set, and a first electronic component of the component supply tape drawn out from this reel 20 is set so as to be located at a component suction position (position where the electronic components are picked up by suction nozzle 26).

Head moving device 25 for moving mounting head 24 in a horizontal direction (XY-directions) and a vertical direction (Z-direction) (refer to FIG. 2) is provided in the electronic component mounter. In mounting head 24, one or multiple suction nozzles 26 for picking up the electronic components fed to the component suction position by feeder 23 are held downward. In addition, in the electronic component mounter, mark imaging camera 36 that moves integrally with mounting head 24 by head moving device 25 (moving device) and images a reference mark of circuit board 12 from above, and component imaging camera 35 (refer to FIG. 2) that images the electronic component picked up on suction nozzle 26 from below are provided.

Figure 2:
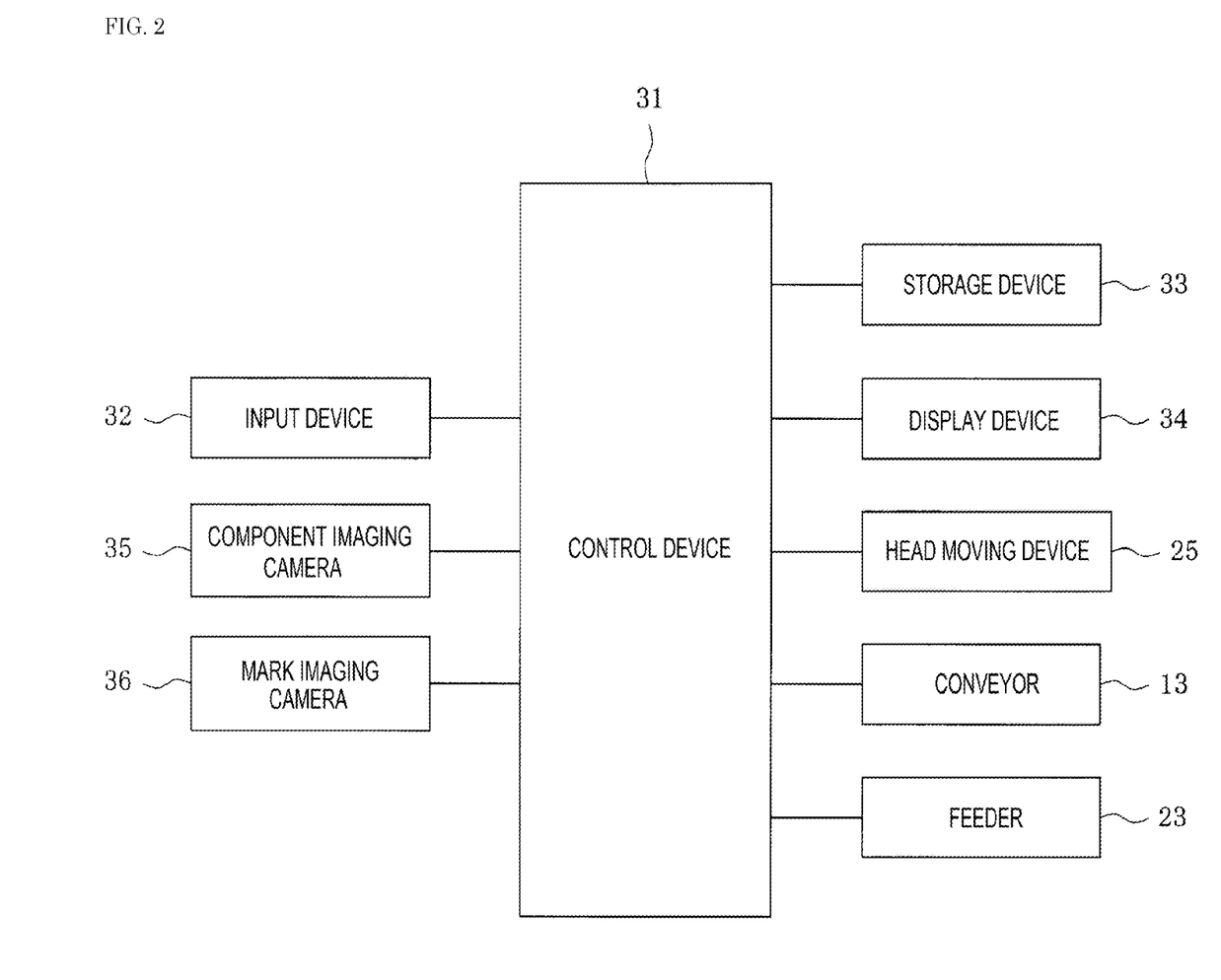
FIG. 2 is a block diagram illustrating a configuration of a control system of the electronic component mounter.

As illustrated in FIG. 2, an input device 32 such as a keyboard, a mouse, or a touch panel, storage device 33 such as a hard disk, a RAM, a ROM, or the like for storing an electronic component mounting position and mounting orientation editing program in FIG. 4 described later, image data, or the like, and display device 34 such as a liquid crystal display, a CRT, or the like are connected to control device 31 of the electronic component mounter.

Control device 31 of the electronic component mounter is configured to include one or multiple computers (one or multiple CPUs), controls an operation of each function of the electronic component mounter according to a production program in which production job data such as a mounting position (X, Y), a mounting orientation, a mounting order of each electronic component mounted on circuit board 12 is registered, and also functions as an image processing device that recognizes each recognition target by processing images imaged by mark imaging camera 36 and component imaging camera 35. Specifically, control device 31 of the electronic component mounter controls the operation of imaging a reference mark as a recognition target of circuit board 12 carried into a predetermined work position by conveyor 13 and clamped, from above by mark imaging camera 36, recognizing the reference mark by processing the captured image, measuring each component mounting positions (position of pad pattern for mounting each electronic component) on circuit board 12 with reference to the position of the reference mark, moving mounting head 24 along the path of the component suction position component imaging position component mounting position, imaging the electronic component by component imaging camera 35 by picking up the electronic component supplied from feeder 23 by suction nozzle 26 of mounting head 24, measuring the suction position (X, Y) and angle θ of the electronic component by processing the captured image, and mounting the electronic component on the pad pattern of circuit board 12 by correcting a deviation of the suction position (X, Y) and angle θ of the electronic component.

Incidentally, there is a possibility that the mounting position of the electronic component designated in the production program may deviate from the position of the pad pattern (land pattern) of actual circuit board 12 used in production due to the production error or the like of circuit board 12. In addition, there is a possibility that an operator who creates the production program may create the production program by mistaking the mounting orientation of the electronic component.

Figure 3:
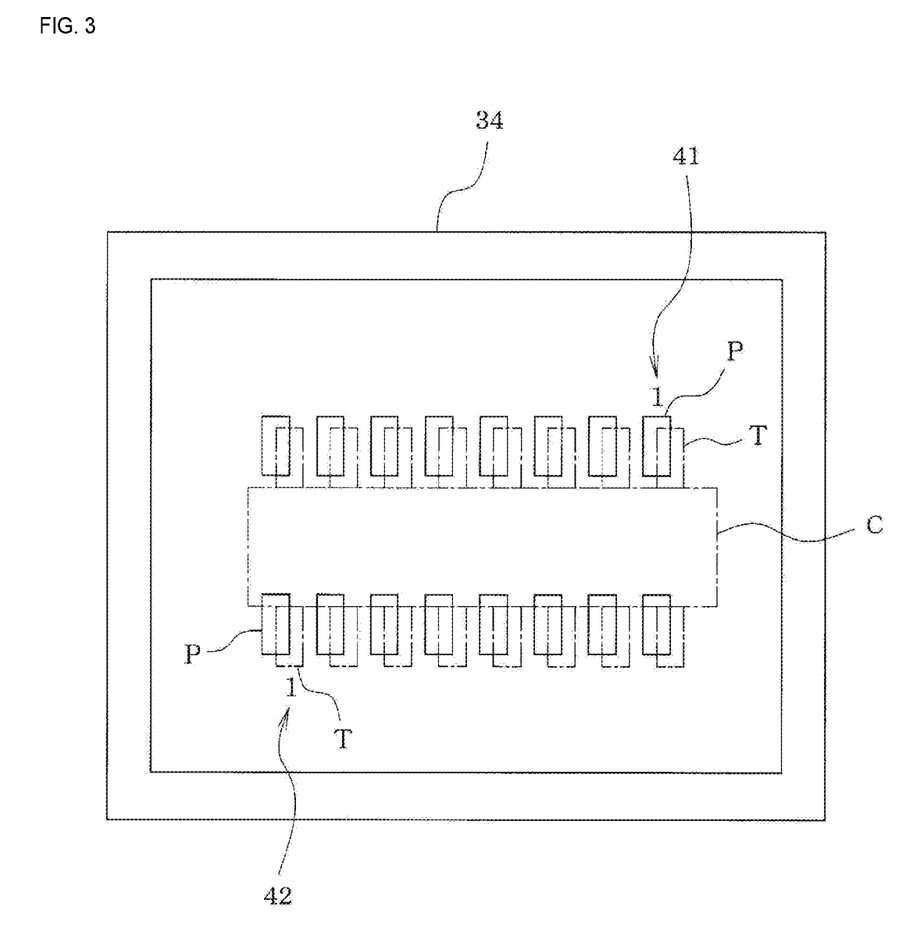
FIG. 3 is a diagram illustrating an example of an electronic component mounting position and mounting orientation editing screen.

Therefore, in this embodiment, control device 31 of the electronic component mounter functions as an electronic component imaginary mounted state drawing section that displays so as to be superimposed the representation of electronic component C to be mounted according to a production program (refer to FIG. 3) on the image of the mounting area on circuit board 12 on display device 34. Furthermore, according to the electronic component mounting position and mounting orientation editing program in FIG. 4 described later, control device 31 of the electronic component mounter images the mounting area including the pattern of pad P on circuit board 12 by mark imaging camera 36 before the start of production, as shown in FIG. 3, displays the imaged image of the pattern of pad P in the mounting area on display device 34, displays the imaginary mounted state of electronic component C to be mounted according to the production program so as to be superimposed on the image of the pattern of pad P in the mounting area, and allows the operator to visually check on the screen of display device 34 whether the mounting position of electronic component C is deviated (positional deviation between terminal T and pad P of electronic component C) and whether the mounting orientation of electronic component C is correct.

However, in many electronic components C, the arrangement of terminals T such as leads and bumps is symmetrical with respect to a center line of a component body section. It cannot be determined whether the mounting orientation of electronic components C having such a symmetrical terminal arrangement is correct or reversed by 180° (rotated by 90°, 180°, or 270° in the case of a square electronic component), only by looking at the imaginary mounted state.

Therefore, in the present embodiment, in the mounting area on circuit board 12, pad pattern orientation indicating portion 41 indicating the orientation of the pattern of pad P is formed, and pad pattern orientation indicating portion 41 and the pattern of pad P are displayed on the image of the mounting area on circuit board 12 imaged by mark imaging camera 36. Furthermore, as illustrated in FIG. 3, control device 31 of the electronic component mounter displays the imaginary mounted state of electronic component C, in which a representation of the electronic component being superimposed over the image of the mounting area on circuit board 12 on display device 34, is displayed with thereto adding component mounting orientation indicating portion 42, indicating the mounting orientation of electronic component C.

Here, pad pattern orientation indicating portion 41 displays pad P for specifying the orientation of the pattern of pad P, among multiple pads P to which multiple terminals T of electronic component C are soldered, with any one of a character, a symbol, a mark, and a color for its distinction from other pads P. In the display example of FIG. 3, as pad P for specifying the orientation of the pattern of pad P, first pad P for soldering first terminal T (first pin) located on the right end upper side of electronic component C is used, where terminal number "1" is printed near first pad P, as pad pattern orientation indicating portion 41. In addition, as terminal T for specifying the mounting orientation of electronic component C of multiple terminals T of electronic component C, first terminal T (first pin) located on the right end upper side of electronic component C is used, where terminal number "1" is displayed near first terminal T, as component mounting orientation indicating portion 42. Display example of FIG. 3 illustrates a state where the mounting orientation of electronic component C is reversed 180°.

Information on imaginary mounted state of electronic component C and which is terminal T for specifying the mounting orientation of electronic component C is based on the part data storing information on electronic component C to be used in production. The part data may be stored in control device 31, or may be stored in a computer that can communicate with control device 31 by a computer external to the electronic component mounter.

In this case, pad P and terminal T, to which pad pattern orientation indicating portion 41 and component mounting orientation indicating portion 42 are added, may be pad P other than the first pad and terminal T other than the first terminal, and for example, may be last pad P and last terminal T, or may be pad P on the left end upper side and terminal T on the left end upper side, or pad P on the left end lower side and terminal T on the left end lower side, or pad P on the right end lower side and terminal T on the right end lower side. In sum, pad P and terminal T which can specify the orientation of the pattern of pad P and the mounting orientation of electronic component C may be added to pad pattern orientation indicating portion 41 and component mounting orientation indicating portion 42 respectively. In addition, display mode of pad pattern orientation indicating portion 41 and component mounting orientation indicating portion 42 is not limited to numbers indicating the terminal number, and specific pad P and specific terminal T may be indicated with characters (for example, "upper", "lower", "left", "right", and the like) other than numbers, indicated with symbols or marks, or specific pad P and specific terminal T may be visually checked by color different from the others.

Figure 4:
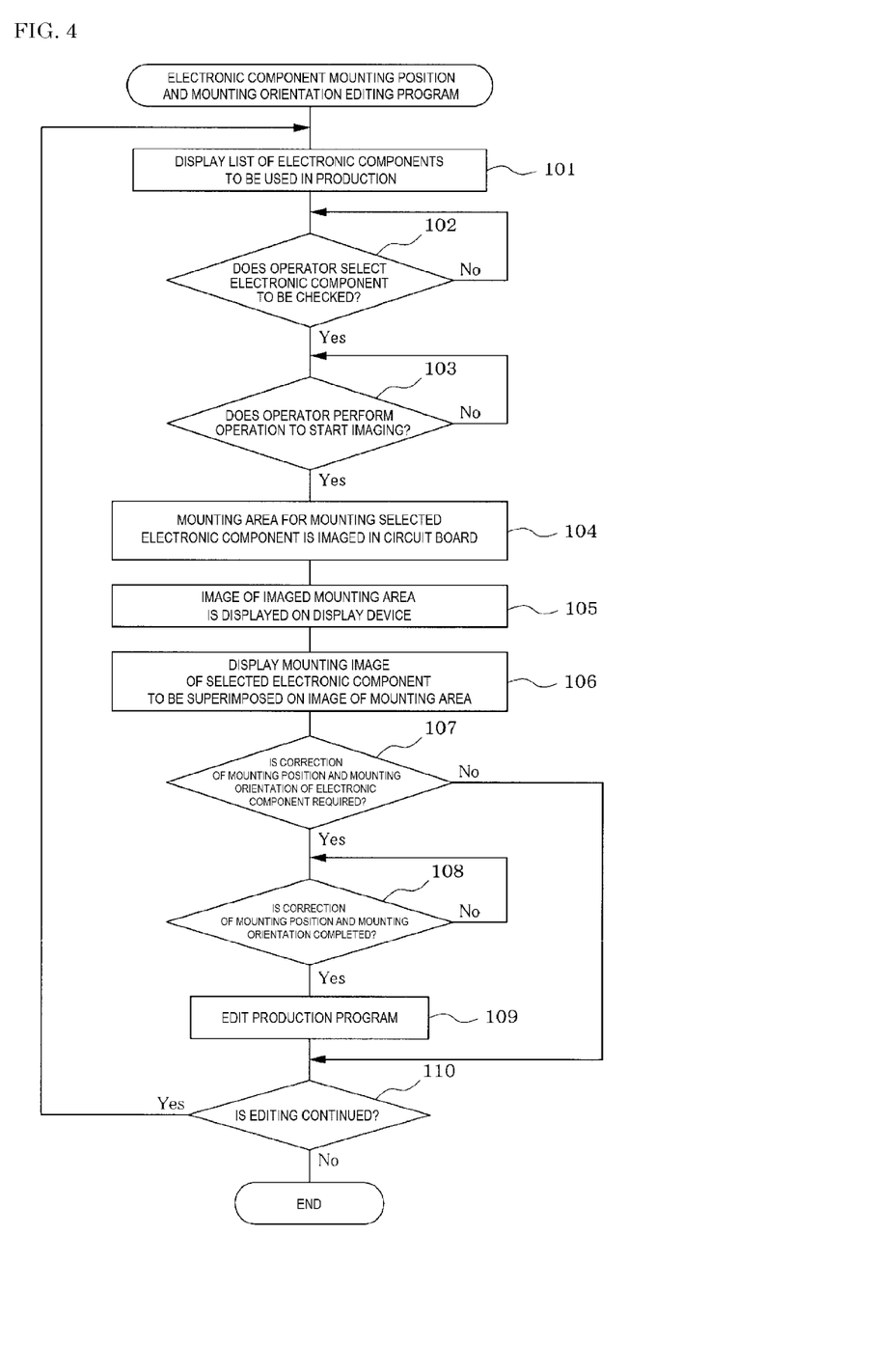
FIG. 4 is a flowchart illustrating a flow of processing of an electronic component mounting position and mounting orientation editing program.

Control device 31 of the electronic component mounter functions as an editing function section that edits the production program by correcting the mounting position and/or mounting orientation of electronic component C by the operator, by executing the electronic component mounting position and mounting orientation editing program in FIG. 4 before the start of production, in a case where the mounting position and/or mounting orientation of electronic component C designated in the production program is deviated from the position of the pattern of pad P or is different from the orientation of pattern of pad P on actual circuit board 12 used for production. Hereinafter, the processing content of the electronic component mounting position and mounting orientation editing program in FIG. 4 will be described.

Electronic component mounting position and mounting orientation editing program in FIG. 4 is executed by control device 31 of the electronic component mounter when the operator operates input device 32 to start editing of the electronic component mounting position and mounting orientation before the start of production. When starting the present program, control device 31 of the electronic component mounter first displays a list of electronic components C to be used in production on display device 34, in Step 101. Thereafter, the processing proceeds to Step 102, and waits until the operator selects electronic component C to be checked in the displayed list of electronic components C.

Thereafter, when the operator selects electronic component C to be checked, the processing proceeds to Step 103, and waits until the operator performs an operation to start imaging by operating input device 32, When the operator has performed the operation to start the imaging, the processing proceeds to Step 104, and the mounting area where selected electronic component C is to be mounted is imaged by mark imaging camera 36 among circuit board 12 used in production.

Thereafter, the processing proceeds to Step 105, and an image of the imaged mounting area on circuit board 12 is displayed on display device 34. Pad pattern orientation indicating portion 41 and the pattern of pad P are displayed on the image of the mounting area. In the next Step 106, the representation of selected electronic component C is displayed so as to be superimposed on the image of the mounting area on circuit board 12 on display device 34. At this time, as illustrated in FIG. 3, the imaginary mounted state of electronic component C, in which the representation of electronic component C being superimposed on the image of the mounting area on circuit board 12 on display device 34, is displayed with thereto adding component mounting orientation indicating portion 42, indicating the mounting orientation of electronic component C. As a result, by visually checking the position of the pad pattern orientation indicating portion 41 and component mounting orientation indicating portion 42 displayed on display device 34 to determine whether the positions of both match, the operator can easily visually check whether the mounting orientation of electronic component C designated in the production program is correct or reversed by 180° (rotated by 90°, 180°, or 270° in the case of a square electronic component). In addition, by displaying the representation of electronic component C so as to be superimposed on the image of the mounting area on circuit board 12, the operator can easily visually check on the screen of display device 34 whether the mounting position of electronic component C is deviated (positional deviation between terminal T and pad P of electronic component C).

Thereafter, the processing proceeds to Step 107, where the operator is inquired whether the mounting position and/or the mounting orientation of selected electronic component C is "to be corrected" or "not to be corrected" by display, voice, or the like. As a result, in a case where the operator operates input device 32 and selects "to correct", the processing proceeds to Step 108 and waits until the operator completes the operation of operating input device 32 to correct the mounting position and/or mounting orientation of electronic component C. Thereafter, when the operation of correcting the mounting position and/or mounting orientation of electronic component C is completed, the processing proceeds to Step 109, the data on the mounting position and/or mounting orientation of electronic component C of the production program is edited (corrected) using the data on the mounting position and/or mounting orientation of electronic component C corrected by the operator, and the processing proceeds to the next Step 110.

On the other hand, in Step 107 described above, in a case where the operator selects "not to correct" the mounting position and/or mounting orientation of electronic component C, the processing skips Steps 108 and 109 and proceeds to Step 110. As a result, for electronic component C that the operator selects "not to correct", the processing proceeds to Step 110 without editing (correcting) the data on the mounting position and mounting orientation of electronic component C of the production program.

In this Step 110, the operator is inquired whether the editing of the production program is "to be continued" or "to be ended" by a display, voice, or the like. As a result, in a case where the operator selects "to continue" by operating input device 32, the above-described processing after Step 101 is executed again, and the operator continues editing the production program for next selected electronic component C. On the other hand, in above Step 110, in a case where the operator selects "to end" the editing of the production program, the program ends.

According to the present embodiment described above, when the image of the mounting area on the circuit board 12 and the representation of electronic component C are superimposed and displayed on the display device 34, the pad pattern orientation indicating portion 41, indicating the orientation of the pattern of pad P of the mounting area, and the component mounting orientation indicating portion, indicating the mounting orientation of electronic component C, are additionally displayed, the operator can easily visually check whether the mounting orientation of electronic component C designated in the production program is correct or reversed by 180° (rotated by 90°, 180°, or 270° in the case of a square electronic component), by visually checking pad pattern orientation indicating portion 41 and component mounting orientation indicating portion 42 displayed on display device 34. By this visual checking, in a case where the operator determines that the mounting orientation of electronic component C does not match the orientation of the pattern of pad P of the mounting area, the operator can edit the production program so as to match the mounting orientation of electronic component C to the orientation of the pattern of pad P. Therefore, it is not necessary to perform test production for checking the mounting orientation of electronic component C before the start of production, and it is possible to improve the productivity.

In addition, in the present embodiment, since it also has a function of editing the production program so as to match the mounting position of electronic component C to the position of the pattern of pad P when the operator looks at the positional deviation between the pattern of pad P of the mounting area and the representation of electronic component C (positional deviation between terminal T of electronic component C and pad P) displayed on display device 34, the mounting position of electronic component C can also be edited with the editing of the mounting orientation of electronic component C.

In the present embodiment, although an example in which the electronic component mounting orientation checking system is equipped on the electronic component mounter is described, for example, an electronic component shape data creation system that creates shape data on electronic components for image processing may be equipped with a function as an electronic component mounting orientation checking system, and an image of the mounting area on circuit board 12 may be imaged by a camera of the electronic component shape data creation system so that the operator may be able to edit the production program using the electronic component shape data creation system. Alternatively, a function as an electronic component mounting orientation checking system may be equipped on a production management computer for managing the production of the electronic component mounting line arranged multiple electronic component mounters, and the operator may be able to edit the production program executed by each electronic component mounter on the electronic component mounting line using the production management computer. At this time, the image of the mounting area on circuit board 12 may be imaged by mark imaging camera 36 of each electronic component mounter.

Alternatively, a system exclusively for editing a production program may be configured, and the system may be equipped with a function as an electronic component mounting orientation checking system.

In addition, it is needless to say that the present disclosure can be implemented by various modifications within the scope not departing from the gist, such as changing the configuration of the electronic component mounter, changing the processing procedure and the processing content of the electronic component mounting position and mounting orientation editing program in FIG. 4, and the like.

REFERENCE SIGNS LIST

12 . . . circuit board, 13 . . . conveyor, 24 . . . mounting head, 25 . . . head moving device, 26 . . . suction nozzle, 31 . . . control device of electronic component mounter (electronic component imaginary mounted state drawing section, editing function section), 32 . . . , input device, 34 . . . display device, 36 . . . mark imaging camera, 41 . . . pad pattern orientation indicating portion, 42 . . . component mounting orientation indicating portion, C . . . electronic component, P . . . pad, T . . . terminal

The invention claimed is:

1. An electronic component mounting orientation checking system for checking a mounting orientation of an electronic component to be mounted on a circuit board according to a production program before starting a production, the system comprising:

a camera configured to image a mounting area including a pad pattern and a pad pattern orientation indicating portion indicating an orientation of the pad pattern on the circuit board on which the electronic component is to be mounted;

a display device configured to display an image of the mounting area imaged by the camera; and circuitry configured to:

display an imaginary mounted state of the electronic component to be mounted according to the production program including (i) a representation of the electronic component and (ii) a component mounting orientation indicating portion indicating the mounting orientation of the electronic component being superimposed on the image of the mounting area including (iii) the pad pattern and (iv) the pad pattern orientation indicating portion on the display device, and edit the production program so that the mounting orientation of the electronic component matches the orientation of the pad pattern, in a case where the mounting orientation of the electronic component designated in the production program does not match the orientation of the pad pattern in the mounting area when an operator looks at the imaginary mounted state of the electronic component displayed on the display device.

2. The electronic component mounting orientation checking system according to claim 1, wherein
the electronic component mounting orientation checking system is equipped on an electronic component mounter, and
the camera is a mark imaging camera configured to image a reference position mark of the circuit board.

3. The electronic component mounting orientation checking system according to claim 1, wherein the circuitry is configured to display a terminal specifying the mounting orientation of the electronic component among multiple terminals of the electronic component with any one of a character, a symbol, a mark, and a color distinguishable from other terminals, as the component mounting orientation indicating portion.

4. The electronic component mounting orientation checking system according to claim 1, wherein the circuitry is configured to edit the production program so that a mounting position of the electronic component matches a position of the pad pattern, when the operator looks at a positional deviation of the pad pattern of the mounting area with respect to the imaginary mounted state of the electronic component displayed on the display device.

5. The electronic component mounting orientation checking system according to claim 1, wherein the pad pattern orientation indicating portion includes a pad numeral.

6. The electronic component mounting orientation checking system according to claim 5, wherein the component mounting orientation indicating portion includes a terminal numeral.

7. The electronic component mounting orientation checking system according to claim 6, wherein
the pad numeral is disposed near a pad of the pad pattern,
the pad numeral corresponds to an order in which the pad is soldered,
the terminal numeral is disposed near a terminal of terminals of the electronic component, and
the terminal numeral corresponds to an order of the terminal with respect to the terminals.

8. The electronic component mounting orientation checking system according to claim 5, wherein
the pad numeral is disposed near a pad of the pad pattern, and
the pad numeral corresponds to an order in which the pad is soldered.

9. The electronic component mounting orientation checking system according to claim 1, wherein the component mounting orientation indicating portion includes a terminal numeral.

10. The electronic component mounting orientation checking system according to claim 9, wherein
the terminal numeral is disposed near a terminal of terminals of the electronic component, and
the terminal numeral corresponds to an order of the terminal with respect to the terminals.

11. The electronic component mounting orientation checking system according to claim 1, wherein the pad pattern orientation indicating portion indicates an order of a pad with respect to other pads.

12. The electronic component mounting orientation checking system according to claim 11, wherein the component mounting orientation indicating portion indicates an order of a terminal with respect to terminals of the electronic component.

13. The electronic component mounting orientation checking system according to claim 1, wherein the component mounting orientation indicating portion indicates an order of a terminal with respect to terminals of the electronic component.

14. An electronic component mounting orientation checking method for checking a mounting orientation of an electronic component to be mounted on a circuit board according to a production program before starting a production, in which a pad pattern orientation indicating portion indicating an orientation of a pad pattern on which the electronic component is mounted is formed in a mounting area including the pad pattern in the circuit board, the method comprising:

imaging the mounting area including the pad pattern and the pad pattern orientation indicating portion on the circuit board with a camera;

displaying an image of the mounting area imaged by the camera on a display device;

displaying an imaginary mounted state of the electronic component to be mounted according to the production program including (i) a representation of the electronic component and (ii) a component mounting orientation indicating portion indicating the mounting orientation of the electronic component being superimposed on the image of the mounting area including (iii) the pad pattern and (iv) the pad pattern orientation indicating portion on the display device; and editing the production program so that the mounting orientation of the electronic component matches the orientation of the pad pattern, in a case where the mounting orientation of the electronic component designated in the production program does not match the orientation of the pad pattern in the mounting area when an operator looks at the imaginary mounted state of the electronic component displayed on the display device.

\* \* \* \* \*